United States Patent [19]

Hiraoka

[11] Patent Number: 4,460,436
[45] Date of Patent: Jul. 17, 1984

[54] DEPOSITION OF POLYMER FILMS BY MEANS OF ION BEAMS

[75] Inventor: Hiroyuki Hiraoka, Saratoga, Calif.

[73] Assignee: International Business Machines Corporation, Armonk, N.Y.

[21] Appl. No.: 529,458

[22] Filed: Sep. 6, 1983

[51] Int. Cl.³ .................. B44C 1/22; C03C 15/00; C03C 25/06; B29C 17/08

[52] U.S. Cl. .................................. 156/643; 156/646; 156/668; 156/904; 204/192 EC; 204/192 E; 427/43.1; 427/255.6; 430/328

[58] Field of Search ............. 156/643, 646, 659.1, 156/668, 904; 252/79.1; 204/192 EC, 192 E, 159.11; 427/43.1, 38, 40, 41, 44, 255.6; 430/296, 313, 434, 328

[56] References Cited

PUBLICATIONS

I. Adesida, J. D. Chinn, L. Rathbun, E. D. Wolf, J. Vac. Sci. Technol., 21(2), Jul./Aug., pp. 666–671 (1982), Dry Development of Ion Beam Exposed PMMA Resist.
H. Kuwano, K. Yoshida, S. Yamazaki, Japanese J. Appl. Physics, 19(No. 10) L615 1980, Dry Development of Resists Exposed to Focused Gallium Ion Beam.
G. N. Taylor, T. M. Wolf, J. M. Moran, J. Vac. Aci. Technol., 19(4) Nov./Dec. 872 (1981), Organosilicon Monomers for Plasma-Developed X-Ray Resists.
S. Hattori, ACS Org. Coating & Plastic Chem., Sep. 12–17, 1982, Kansas City mtg., Organic Coatings and Applied Polymer Science Proceedings, vol. 47, pp. 136–140.

Primary Examiner—William A. Powell
Attorney, Agent, or Firm—Joseph G. Walsh

[57] ABSTRACT

A patterned polymer film is deposited on a substrate by pattern-wise exposing a monomer vapor to a beam of ions and dry developing by etching with oxygen plasma.

6 Claims, No Drawings

DEPOSITION OF POLYMER FILMS BY MEANS OF ION BEAMS

DESCRIPTION

Technical Field

The present invention is concerned with a process for depositing patterned polymer films for microlithography. In particular, it is concerned with such a process which is carried out using a beam of ions.

BACKGROUND ART

All ion beam lithographic processes consist of ion beam exposure of polymer films in order to reduce oxygen plasma etch rates of the films, and then dry development by oxygen plasma. In the original work of Kuwano and his coworkers, 20 KeV accelerated focused gallium ion beams were used to reduce oxygen plasma etch rates of exposed areas. See H. Kuwano, K. Yoshida and S. Yamazaki, Japanese J. Appl. Physics, 19(No. 10) L615 (1980). Wolf and his coworkers have been successful in obtaining submicron poly(methyl methacrylate) patterns using 40 KeV Si+ ions by flood exposure through a self-supporting mask. See I. Adesida, J. D. Chinn, L. Rathbun and E. D. Wolf, J. Vac. Sci. Technol., 212(2), July/Aug pp. 666–671 (1982). In these references, either specially designed ion beam guns or ion implantation systems are required. By implanting metallic ions like Si+, Ga+, the oxygen plasma etch rates of the resist films are reduced, thereby causing differentiation of the etch rates between exposed and unexposed areas, and resulting in dry development of polymer patterns.

G. Taylor and his coworkers used polymers films uniformly blended with monomer organosilicon for plasma-developed x-ray resists study. See G. N. Taylor, T. M. Wolf and J. M. Moran, J. Vac. Aci. Technol., 19(4) Nov./Dec. 872 (1981).

S. Hattori has reported post-grafting of trimethylvinylsilane onto poly(methyl methacrylate) after electron beam exposures. See S. Hattori et al, ACS Org. Coating & Plastic Chem. Report No. 33, Sept. 12–17, 1982, Kansas City meeting. Because an electron beam gun cannot operate at pressure as high as $1 \times 10^{-4}$ torr, he had to transfer the exposed wafers to another chamber for the purpose of grafting.

DISCLOSURE OF THE INVENTION

According to the present invention, a patterned polymer film is deposited on a substrate by confining a monomer vapor in a closed chamber containing said substrate, pattern-wise exposing said vapor to a beam of ions and thereby causing deposition of a polymer film on said substrate, and then dry developing by etching said polymer film with oxygen plasma.

The present invention has a very big advantage over the prior art, in which it was not possible to carry out all the steps of the process in a single chamber. In the present invention, however, because ion beam guns can operate at a pressure as high as $1 \times 10^{-4}$ to $1 \times 10^{-3}$ torr, simultaneous ion beam exposure and deposition are possible.

In the present invention, any polymerizable organic vapor can be used as the monomer. The most preferred monomers are organosilicon compounds such as tetravinylsilane, and styrene or other phenyl vinyl compounds. Other useful monomers include, for example, acrylonitrile, methacrylonitrile, methyl methacrylate and phenol.

The most preferred ion beam is of hydrogen ions, i.e., protons. Other ion beams such as $He^{30}$, $Ar^{30}$ and others can also be used.

The polymer films may be deposited on many different substrates. For example, the substrate may be another polymer, such as poly(methyl methacrylate), or a novolac resin. Of particular interest is the use of a silicon wafer as the substrate. Resist patterns of 0.5 $\mu$m thickness with sloped wall profiles (due to a slanted gun position relative to the wafer position) have been obtained directly from styrene vapor. This technique eliminates several processes required in conventional lithographic processes, like formulation of resist solutions, spin-coating, prebaking, developments, etc. Besides, no problems of adhesion, cracking, abrasion, etc. appear. The polymer films thus obtained are exceedingly $CF_4$ plasma and reactive ion etch resistant, which is of advantage in further microcircuit fabrication processes.

Thin polymer films of organometallic compounds, including organosilicons, are deposited on polymer films like PMMA, novolac resins or any other kind of polymer films. The deposition is assisted by low energy ion beam exposure, like 5 KeV $H^{30}$ beams. Ion beams are energetic enough to generate radicals from any kind of organic compounds. For lithographic applications, however, organometallic compounds like organosilicons, organotins and other volatile organometallic compounds are preferred.

Any conventional ion beam gun can be used for the process of the present invention, for example, one from Commonwealth Scientific Composition.

PREFERRED EMBODIMENTS

A poly(methyl methacrylate) substrate was placed inside a closed chamber containing tetravinyl silane at a pressure of $1 \times 10^{-1}$ torr. A Magmiller ion gun from Commonwealth Scientific Corp., Alexandria, Va., 2-30 gun was used with a hydrogen pressure through the gun of $3 \times 10^{-5}$ torr. The exposure was conducted at $1 \times 10^{-4}$ torr, with the gun directed toward the substrate through a gas inlet tube. The ion beam exposure and simultaneous deposition were carried out for 30 minutes with the ion beam current of 10 to 50 $\mu$A, amounting to ion dose of $1 \times 10^{-4}$ C/cm$^2$. This dose can be reduced significantly either by increasing the silane pressure, or by using postgrafting after the ion beam exposure.

Any kind of polymer film can be used as long as it is etched away in oxygen plasma. PMMA results in positive tone patterns in wet development after ion beam exposures. Negative tone polymer patterns are obtained in dry oxygen plasma or RIE development with our present technique; the deposited poly(tetravinylsilane) film acted as barrier layer for oxygen plasma.

Polymer patterns are developed in either oxygen plasma or oxygen RIE; in our RIE condition the oxygen pressure was 100 micron, with 4 sccm flow, with a bias potential applied to the wafer of $-250$ V; the etch time was 20 minutes for 2 $\mu$m thickness.

In another preferred embodiment of the present invention, a silicon wafer is used as the substrate for the deposition of a film of polystyrene. The mask used was copper grid wired laid in two levels; each level was separated at least 200 $\mu$m from another; by placing them at slightly off-set position fairly narrow lines could be defined.

Polymer styrene films with smooth surfaces were deposited in H+ beam assisted polymerization in well defined patterns.

I claim:

1. A process for depositing a patterned polymer film on a substrate, said process being characterized by the steps of:
   (1) confining a monomer vapor in a closed chamber containing said substrate;
   (2) pattern-wise exposing said monomer vapor to a beam of ions to cause deposition of a polymer film on said substrate, and
   (3) dry developing by etching said polymer film with oxygen plasma.

2. A process as claimed in claim 1 wherein the exposing to ions and the etching with oxygen plasma take place in the same chamber.

3. A process as claimed in claim 1 wherein the monomer is an organosilicon compound.

4. A process as claimed in claim 1 wherein the monomer is a phenyl vinyl compound.

5. A process as claimed in claim 1 wherein the ion beam is a beam of protons.

6. A process as claimed in claim 1 wherein the substrate is a silicon wafer.

* * * * *

UNITED STATES PATENT OFFICE
CERTIFICATE OF CORRECTION

PATENT NO. : 4,460,436

DATED : July 17, 1984

INVENTOR(S) : HIROYUKI HIRAOKA

It is certified that error appears in the above-identified patent and that said Letters Patent are hereby corrected as shown below:

Col. 2, line 4, "$He^{30}$, $Ar^{30}$" should read --$He^+$, $Ar^+$--;

Col. 2, line 25, "$H^{30}$" should read --$H^+$--;

Col 2, line 38, "$1 \times 10^{-1}$" should read --$1 \times 10^{-4}$--.

Signed and Sealed this

Eleventh Day of December 1984

[SEAL]

Attest:

GERALD J. MOSSINGHOFF

Attesting Officer

Commissioner of Patents and Trademarks